United States Patent
Chang et al.

(10) Patent No.: US 11,271,082 B2
(45) Date of Patent: Mar. 8, 2022

(54) SEMICONDUCTOR DEVICES WITH MEMORY CELLS

(71) Applicant: GLOBALFOUNDRIES Singapore Pte. Ltd., Singapore (SG)

(72) Inventors: Wei Chang, Singapore (SG); Eng Huat Toh, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 96 days.

(21) Appl. No.: 16/741,716

(22) Filed: Jan. 13, 2020

(65) Prior Publication Data

US 2021/0217859 A1 Jul. 15, 2021

(51) Int. Cl.
*H01L 29/417* (2006.01)
*H01L 21/8234* (2006.01)
*H01L 27/088* (2006.01)

(52) U.S. Cl.
CPC .................. *H01L 29/41725* (2013.01); *H01L 21/823475* (2013.01); *H01L 27/088* (2013.01)

(58) Field of Classification Search
CPC ....... H01L 29/41725; H01L 21/823475; H01L 27/088
See application file for complete search history.

(56) References Cited

U.S. PATENT DOCUMENTS 7,423,903 B2 9/2008 Lin et al.
2019/0067467 A1* 2/2019 Zhou .................. H01L 29/6681

OTHER PUBLICATIONS

A. Villaret et al., W/Ta2O5/TaN MIM capacitor for High Density One Time Programmable Memory, 2007, 230-233, IEEE, New Jersey, US.
Kai Ping HuAng et al., 1-kb FinFET Dielectric Resistive Random Access Memory Array in 1×nm CMOS Logic Technology for Embedded Nonvolatile Memory Applications, IEEE Transactions on Electron Devices, Nov. 2016, 4273-4278, vol. 63, No. 11, IEEE, New Jersey, US.
Ping Chun Peng et al., High-Density FinFET One-Time Programmable Memory Cell With Intra-Fin-Cell-Isolation Technology, IEEE Electron Device Letters, Oct. 2015, 1037-1039, vol. 36, No. 10, IEEE, New Jersey, US.
Woan Yun Hsiao et al., A New High-Density Twin-Gate Isolation One-Time Programmable Memory Cell in Pure 28-nm CMOS Logic Process, IEEE Transactions on Electron Devices, Jan. 2015, 121-127, vol. 62, No. 1, IEEE, New Jersey, US.

* cited by examiner

*Primary Examiner* — Wasiul Haider
(74) *Attorney, Agent, or Firm* — David Cain

(57) ABSTRACT

The present disclosure generally relates to semiconductor devices, and more particularly, to semiconductor devices having memory cells for multi-bit programming and methods of forming the same. The present disclosure provides a semiconductor device including an isolation region disposed on a substrate, a pair of diffusion structures disposed upon the isolation region, a dielectric layer that covers side surfaces of the diffusion structures, and a gate structure disposed on the dielectric layer and between the diffusion structures, where the gate structure is electrically coupled to the diffusion structures.

19 Claims, 12 Drawing Sheets

View X-X'

SEMICONDUCTOR DEVICES WITH MEMORY CELLS

FIELD OF THE INVENTION

The disclosed subject matter relates generally to semiconductor devices, and more particularly to semiconductor devices having memory cells for multi-bit programming and methods of forming the same.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used electronic products due to its ability to retain data for long periods of time.

NV memory devices may be categorized based on their read/write mechanism. Exemplary categories for NV memory may include resistive random-access memory (Re-RAM), erasable programmable read-only memory (EPROM), flash memory, ferroelectric random-access memory (FeRAM), and magnetoresistive random-access memory (MRAM). NV memory devices may be built with device components such as transistors (e.g., fin-shaped field-effect transistors (FinFETs), ferroelectric field-effect transistors (FeFETs), complementary metal-oxide semiconductor (CMOS) transistors), and capacitors (e.g., metal-insulator-metal (MIM) capacitors).

NV memory devices may be built in the form of memory cells, each cell storing bits of binary information and may be operated by bit lines, word lines, and/or source lines. These devices may also be programmed using one-time programmable (OTP) or multi-time programmable (MTP) technologies. However, devices programmed using OTP/MTP technologies are found to have large cell sizes, which can be disadvantageous as large cell sizes lower the packing density of device components in IC chips.

With the semiconductor industry's drive for higher density, higher performance, lower-cost devices and the implementation of nanometer-scale process nodes, there is a need to provide semiconductor devices that can overcome, or at least ameliorate, one or more of the disadvantages as described above.

SUMMARY

In an aspect of the present disclosure, there is provided a semiconductor device including an isolation region disposed on a substrate, a pair of diffusion structures disposed upon the isolation region, a dielectric layer that covers side surfaces of the diffusion structures, and a gate structure disposed on the dielectric layer and between the diffusion structures, where the gate structure is electrically coupled to the diffusion structures.

In another aspect of the present disclosure, there is provided a semiconductor device including an isolation region disposed on a substrate, a first array above the isolation region, the first array including a first gate structure disposed on a first dielectric layer and a second gate structure disposed on a second dielectric layer, a first pair of diffusion structures disposed upon the isolation region, the first dielectric layer and the second dielectric layer cover side surfaces of the first pair of diffusion structures, where the first and second gate structures are disposed between and electrically coupled to the first pair of diffusion structures, a second array above the isolation region and spaced apart from the first array, the second array including a third gate structure disposed on a third dielectric layer and a fourth gate structure disposed on a fourth dielectric layer, and a second pair of diffusion structures disposed upon the isolation region, the third dielectric layer and the fourth dielectric layer cover side surfaces of the second pair of diffusion structures, where the third and fourth gate structures are disposed between and electrically coupled to the second pair of diffusion structures.

In yet another aspect of the present disclosure, there is provided a method of forming a semiconductor device by providing a substrate, forming an isolation region on the substrate, forming a pair of diffusion structures upon the isolation region, forming a dielectric layer to cover side surfaces of the diffusion structures, and forming a gate structure on the dielectric layer, where the gate structure is between the pair of diffusion structures.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

FIG. 1B is a plan view of the exemplary semiconductor device shown in FIG. 1A, in accordance with embodiments of the present disclosure. Line X-X' indicates the cross-section line in which the view shown in FIG. 1A is taken from.

FIG. 1C is a perspective view of the exemplary semiconductor device shown in FIGS. 1A and 1, in accordance with embodiments of the present disclosure. Line X-X' indicates the cross-section line in which the view shown in FIG. 1A is taken from.

FIG. 2B is a plan view of the exemplary semiconductor device shown in FIG. 2A, in accordance with embodiments of the present disclosure. Line X-X' indicates the cross-section line in which the view shown in FIG. 2A is taken from.

FIG. 2C is a perspective view of the exemplary semiconductor device shown in FIGS. 2A and 2B, in accordance with embodiments of the present disclosure. Line X-X' indicates the cross-section line in which the view shown in FIG. 2A is taken from.

FIG. 3 is a cross-sectional view depicting a device structure for forming a semiconductor device, in accordance with embodiments of the present disclosure.

FIG. 4A is a cross-sectional view and FIG. 4B is a plan view depicting the formation of a conductive material above the device structure of FIG. 3, in accordance with embodiments of the present disclosure. FIG. 4A is a cross-sectional view taken along section line X-X' in FIG. 4B.

FIG. 5A is a cross-sectional view and FIG. 5B is a plan view depicting the patterning of the conductive material shown in FIGS. 4A and 4B, in accordance with embodiments of the present disclosure. FIG. 5A is a cross-sectional view taken along section line X-X' in FIG. 5B.

FIG. 6A is a cross-sectional view and FIG. 6B is a plan view depicting the formation of a gate structure in the cavity shown in FIGS. 5A and 5B, in accordance with embodiments of the present disclosure. FIG. 6A is a cross-sectional view taken along section line X-X' in FIG. 6B.

FIG. 7 is a cross-sectional view depicting the formation of a conductive line above the device structure of FIG. 6A, in accordance with embodiments of the present disclosure.

DETAILED DESCRIPTION

Various illustrative embodiments of the present disclosure are described below. The embodiments disclosed herein are exemplary and not intended to be exhaustive or limiting to the present disclosure.

Figure 1A:
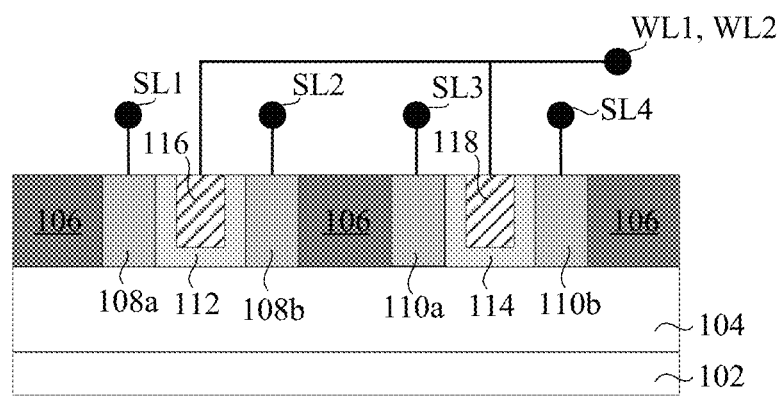
FIG. 1A is a cross-sectional view of an exemplary semiconductor device in accordance with embodiments of the present disclosure.

Referring to FIG. 1A, a cross-sectional view of an exemplary semiconductor device is shown. The device may include a substrate 102, an isolation region 104 disposed on the substrate 102, and a dielectric isolation layer 106 disposed on the isolation region 104. Diffusion structures 108a, 108b, 110a, and 110b are disposed in the dielectric isolation layer 106 and disposed upon the isolation region 104. The diffusion structures may include a first pair of diffusion structures 108a and 108b and a second pair of diffusion structures 110a and 110b.

The substrate 102 may be made of any semiconductor material, such as silicon, germanium, silicon germanium (SiGe), silicon carbide, and those consisting essentially of III-V compound semiconductors, such as GaAs, II-VI compound semiconductors such as ZnSe. The substrate 102 may also be a semiconductor-on-insulator substrate or a bulk semiconductor substrate. Examples of a semiconductor-on-insulator substrate may include, but not limited to, an organic semiconductor or a layered semiconductor, such as Si/SiGe, a silicon-on-insulator (SOI), a germanium-on-insulator (GOI), or a SiGe-on-insulator. A portion or the entire semiconductor substrate 102 may be amorphous, polycrystalline, or monocrystalline.

The isolation region 104 may contain an oxide material such as silicon dioxide. Several isolation regions 104 may be formed on the substrate 102. The isolation region 104 may be a shallow trench isolation region or a deep trench isolation region. Although not shown in the accompanying drawings, other IC components such as bipolar junction transistors (BJTs) and/or field-effect transistors (FETs) may be built on the substrate 102 and separated by the isolation regions 104.

The diffusion structures 108a, 108b, 110a, and 110b may function as a channel or pathway for current flow (i.e., diffusion of electrons) and may be made of a conductive material. Exemplary conductive materials for the diffusion structures may include, but limited to, a crystalline material such as polycrystalline silicon, amorphous silicon, or a metallic material such as tungsten, cobalt, nickel, copper, aluminum, or an alloy thereof.

The dielectric isolation layer 106 may function as an electrical insulator (e.g., an interlayer dielectric (ILD)) to prevent electrical shorts across the pairs of diffusion structures 108a, 108b, 110a, and 110b. The dielectric isolation layer 106 may contain an oxide material such as silicon dioxide.

As shown in FIG. 1A, dielectric layers 112 and 114 and gate structures 116 and 118 are disposed between the first 108a and 108b and second 110a and 110b pairs of diffusion structures. As an illustrative example, the dielectric layer 112 is disposed upon the isolation region 104 and covers side surfaces of the pair of diffusion structures 108a and 108b. The gate structure 116 is disposed on the dielectric layer 112. Additionally, the gate structure 116 is electrically coupled to its adjacent diffusion structures 108a and 108b through the dielectric layer 112.

The diffusion structures 108a, 108b, 110a, and 110b may be connected to source lines SL1, SL2, SL3, and SL4, while the gate structures 116 and 118 may be connected to word lines WL1 and WL2. As used herein, the terms "source line(s)", "bit line(s)", and "word line(s)" refers to electrical terminal connections that link cells in a memory device circuitry. Although not shown in the accompanying drawings, it should be noted that alternative ways of configuring terminal connections (e.g., source lines, word lines, bit lines) to the diffusion structures 108a, 108b, 110a, and 110b and the gate structures 116 and 118 are contemplated within the scope of the disclosure. For example, the diffusion structures 108a, 108b, 110a, and 110b may alternatively be connected to word lines or bit lines while the gate structures 116 and 118 may be connected to source lines or bit lines.

The dielectric layers 112 and 114 may include an oxide-containing dielectric material. The oxide-containing dielectric material may be made of a high-K dielectric material or silicon dioxide ($SiO_2$). The term "high-K" as used herein refers to a material having a dielectric constant (i.e., K value) that is greater than 5, preferably between 25 to 30. The high-K dielectric material may include, but not limited to, tantalum pentoxide ($Ta_2O_5$), magnesium oxide (MgO), hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2. The dielectric layers 112 and 114 may have thicknesses in the range of about 1 nm to about 20 nm.

The gate structures 116 and 118 may have a metal electrode and a work-function material (WFM) component. The metal electrode may be made of an electrically conductive material. Examples of electrically conductive materials for the metal electrode may include, but not limited to, tungsten, cobalt, nickel, copper, aluminum.

The WFM component may include any metallic compound or a composition of metallic compounds capable of modifying the work function property of a gate. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

The gate structures 116 and 118 may be configured to receive a voltage to control an electrical characteristic of the coupled diffusion structures 108a, 108b, 110a, and 110b. As an illustrative example, the gate structure 116 may be configured to connect to a word line WL1. The dielectric layer 112 has resistive properties and electrically insulates the gate structure 116 from the pair of diffusion structures 108a and 108b. A voltage may be applied to the gate structure 116 and an electric field may be generated across the dielectric layer 112. The generated electric field enables the gate structure 116 to modulate the conductance of the first pair of diffusion structures 108a and 108b. The resistance value of the dielectric layers 112 and 114 and the voltage supplied to the gate structures 116 and 118 may be optimized or adjusted for the control of the electrical characteristic of the diffusion structures 108a, 108b, 110a, and 110b.

Figure 1B:
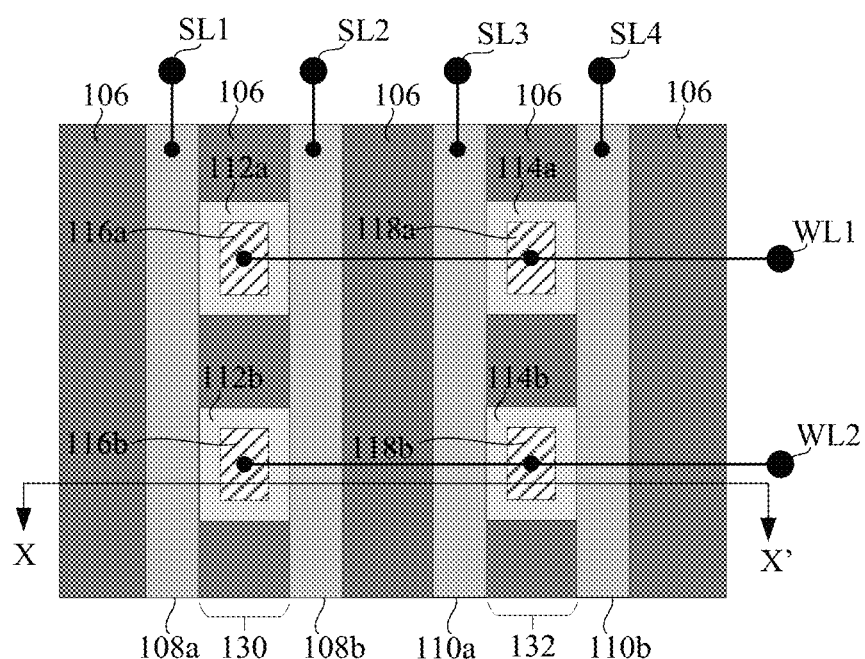

Referring to FIG. 1B, a plan view illustrating the layout of the exemplary semiconductor device is shown. The line X-X' indicates the cross-section line in which the view shown in FIG. 1A is taken from. In a simplified view, the isolation region 104 and the substrate 102 are not shown, however, it should be understood that the layout shown in FIG. 1B is positioned above the isolation region 104 and the substrate 102.

As shown, the device may include a first array 130 and a second array 132 spaced apart from the first array 130. The first array 130 may include a first gate structure 116a disposed on a first dielectric layer 112a and a second gate structure 116b disposed on a second dielectric layer 112b. The second array 132 may include a third gate structure 118a disposed on a third dielectric layer 114a and a fourth gate structure 118b disposed on a fourth dielectric layer 114b. In some embodiments, the first, second, third and fourth gate structures are peripherally enclosed by the first, second, third and fourth dielectric layers, respectively. Also shown in FIG. 1B, within each array, the dielectric layers are spaced apart from one another by the dielectric isolation layer 106.

The first array 130 may be arranged between a first pair of diffusion structures 108a and 108b while the second array 132 may be arranged between a second pair of diffusion structures 110a and 110b. The gate structures in the first array 130 may be coupled to the gate structures in the second array 132. For example, the first gate structure 116a may be connected to the third gate structure 118a by the first word line WL1, while the second gate structure 116b may be connected to the fourth gate structure 118b by the second word line WL2. Additionally, as shown in FIG. 1B, the diffusion structures 108a, 108b, 110a, and 110b may be connected to source lines SL1, SL2, SL3, and SL4.

Figure 1C:
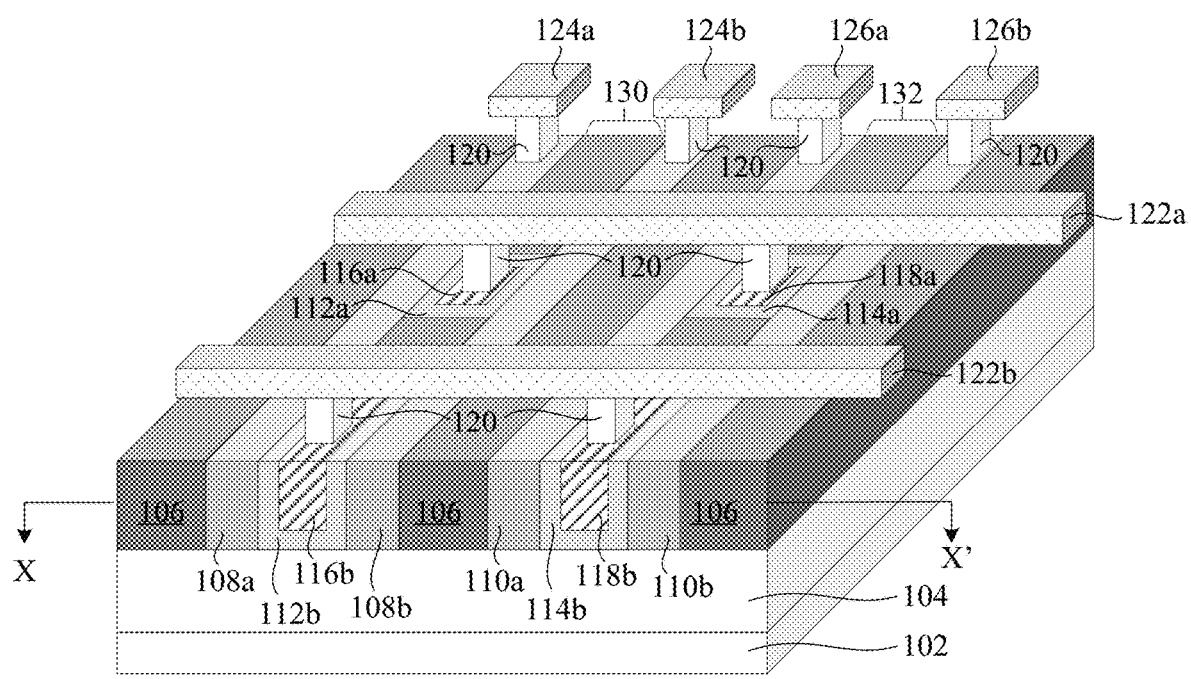

FIG. 1C depicts a perspective view of the exemplary semiconductor device shown in FIGS. 1A and 1B. As shown, interconnect structures may be formed above the device structure to provide routing of electrical signals to and from the gate structures and the diffusion structures. The interconnect structures may be made of a metallic material such as copper, cobalt, aluminum or an alloy thereof.

In the embodiment shown in FIG. 1C, the interconnect structures may include interconnect vias 120 and conductive lines 122a, 122b, 124a, 124b, 126a, and 126b. The conductive lines 122a, 122b, 124a, 124b, 126a, and 126b may function as source lines or word lines. In particular, interconnect vias 120 are disposed on the first gate structure 116a and the third gate structure 118a. The interconnect vias 120 are further connected to a first word line 122a. Similarly, interconnect vias 120 are disposed on the second gate structure 116b and the fourth gate structure 118b and are further connected to a second word line 122b.

Interconnect vias 120 are also disposed on the first pair of diffusion structures 108a and 108b and further connected to a first 124a and second 124b source lines. Similarly, the second pair of diffusion structures 110a and 110b have interconnect vias 120 disposed thereon and further connected to a third 126a and fourth 126b source lines. In some embodiments, the gate structures 116a and 116b in the first array 130 are connected to the gate structures 118a and 118b in the second array 132 by conductive lines (e.g., the first 122a and second 122b word lines) that extend perpendicularly across the diffusion structures 108a, 108b, 110a, and 110b.

Figure 1D:
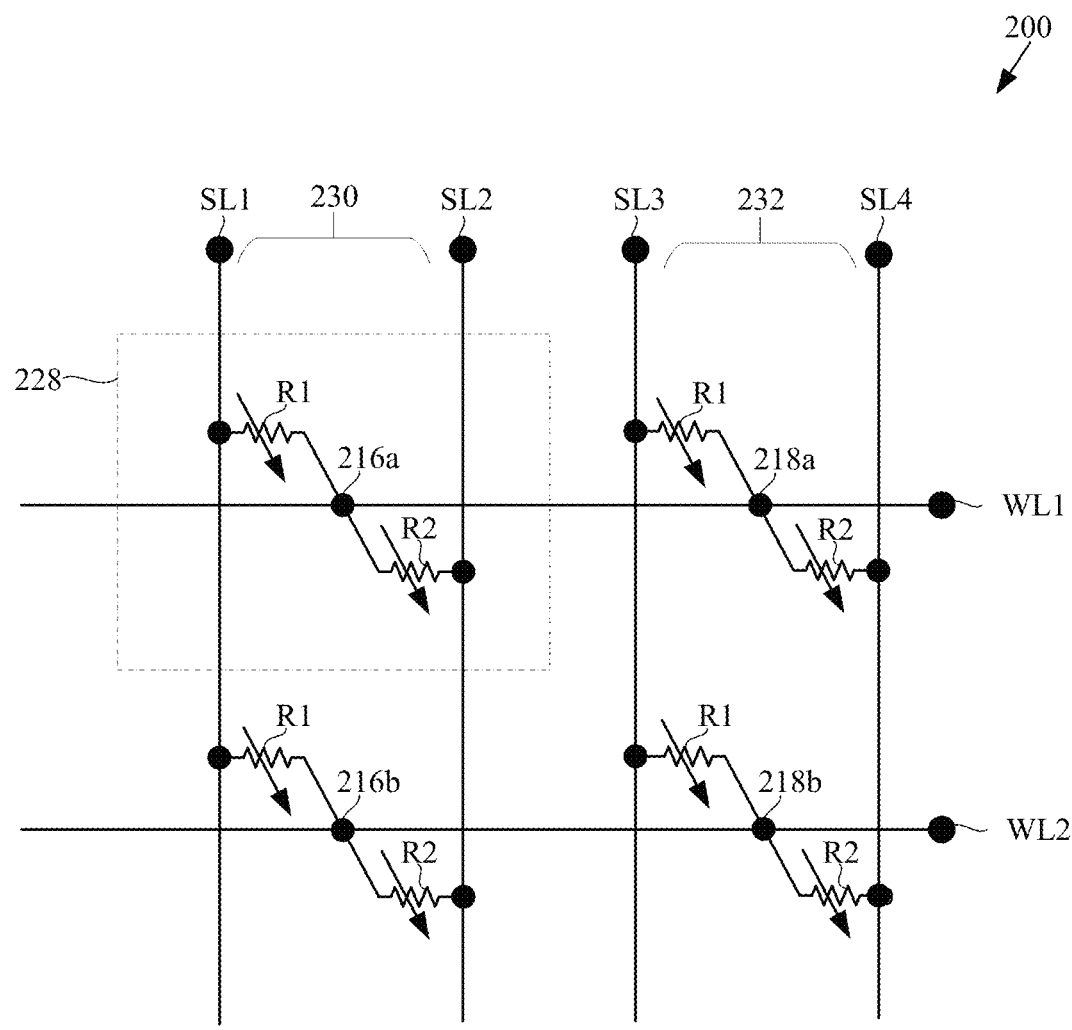
FIG. 1D is a circuit diagram representing the exemplary semiconductor device of FIGS. 1A-1C, in accordance with the present disclosure.

Referring to FIG. 1D, a circuit diagram 200 depicting the electrical connections in the exemplary semiconductor device of FIGS. 1A-1C is shown. The circuit diagram 200 includes the first array 230 having the first gate 216a and the second gate 216b, and the second array 232 having the third gate 218a and the fourth gate 218b.

The first gate 216a and the second gate 216b are connected to the first pair of source lines SL1 and SL2. The third gate 218a and the fourth gate 218b are connected to the second pair of source lines SL3 and SL4. The circuit diagram 200 also includes the first word line WL1 and the second word line WL2. The first word line WL1 is connected to the first gate 216a and the third gate 218a while the second word line WL2 is connected to the second gate 216b and the fourth gate 218b. Resistors R1 and R2 in the circuit diagram 200 may correspond to the implementation of each dielectric layer 112a, 112b, 114a, and 114b in the device structures shown in FIGS. 1B and 1C.

Each memory cell in the device of the present disclosure may be programmed using OTP or MTP technologies. Additionally, in a multi-level cell application, each memory cell can be programmed as single bit or multi bit, depending on the level of control.

As shown in FIG. 1D, each gate 216a, 216b, 218a, and 218b is connected to the source lines SL1, SL2, SL3, and SL4 through the resistors R1 and R2. In an embodiment, a memory cell 228 may include a gate 216a coupled to the source lines SL1 and SL2 and the word line WL1. In the circuit diagram 200 shown in FIG. 1D, the memory cell 228 may be programmed with two bits, the first bit having the connection between the gate 216a and the source line SL1, and the second bit having the connection between the gate 216a and the source line SL2. Accordingly, each array 230, 232 in the circuit diagram 200 may be programmed with four bits.

During operation of the memory cell 228, an "operating" voltage may be supplied from the first word line WL1 to the gate 216a while an "inhibiting" voltage may be supplied from the second word line WL2 to the gate 216a. The source lines SL1, SL2, act as ground terminals. The inhibiting voltage is lower than the operating voltage by 50% to enable changes in the resistance state of the resistor R1 (e.g., from a high resistance state to a low resistance state, or from a low resistance state to a high resistance state). For MTP memory cells, the resistance state of R1 may be varied multiple times between low and high resistance states whereas for OTP memory cells, the resistance state of R1 is varied between low and high resistance states only once.

Advantageously, the device of the present disclosure may achieve a smaller cell size as compared to conventional devices. For example, by configuring a gate structure between a pair of diffusion structures, it is found that the cell size in the device of the present disclosure is significantly reduced (e.g., at least 50% reduction), which increases the packing density of device components in IC chips and therefore results in higher performance of the chips (e.g., faster processing speed). Additionally, the configuration of the present device is found to enable the use of a single gate to control the transmission of electrical signals to at least two source lines. Also advantageously, the device of the present disclosure may enable multi-bit programming of memory cells with significant reduction in cell sizes.

Figure 2A:
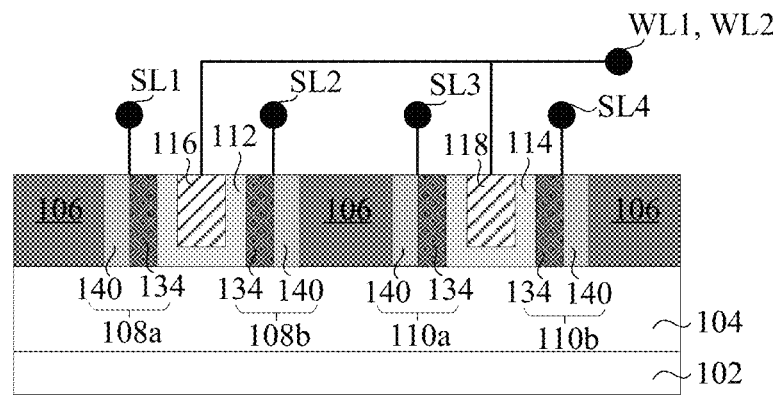
FIG. 2A is a cross-sectional view of another exemplary semiconductor device in accordance with embodiments of the present disclosure.

Referring to FIG. 2A, a cross-sectional view of another exemplary semiconductor device is shown. The structure of FIG. 2A is similar to that of FIG. 1A, except that each diffusion structure 108a, 108b, 110a, 110b shown in FIG. 2A includes a first doped region 134 and a second doped region 140. Each dielectric layer 112, 114 may be directly overlying the first doped region 134 of each diffusion structure 108, 110. For example, in FIG. 2A, the first doped region 134 of each diffusion structure 108a, 108b, 110a, 110b contacts each corresponding adjacent dielectric layer 112, 114.

The first doped region 134 and the second doped region 140 may have opposite conductivity types with respect to each other. For example, if the first doped region 134 is of N-type conductivity, then the second doped region 140 is of P-type conductivity, or vice versa. Exemplary dopants for N-type conductivity doping may include, but not limited to, arsenic, phosphorus, or antimony. Exemplary dopants for P-type conductivity doping may include, but not limited to, boron, aluminum, or gallium.

Figure 2B:
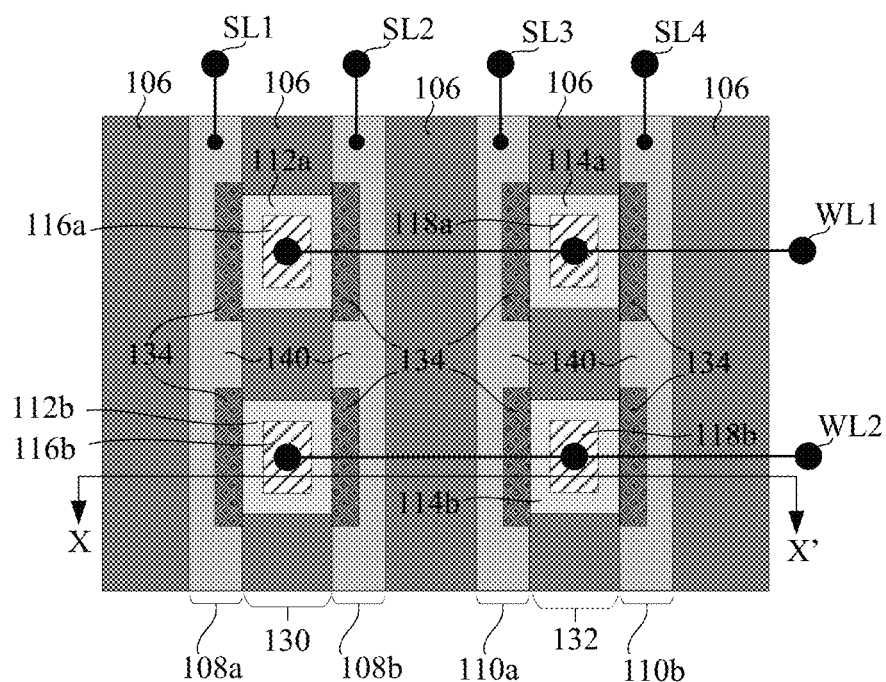
Figure 2C:
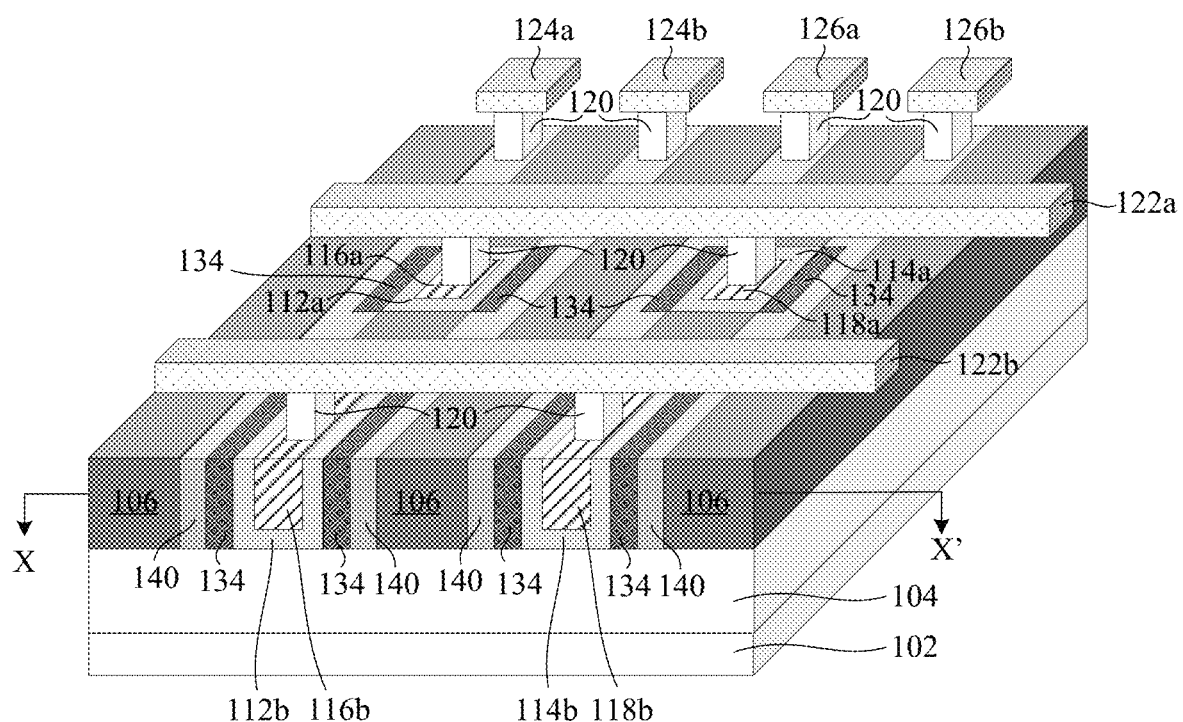

FIGS. 2B and 2C are a plan view and a perspective view, respectively, of the device structure shown in FIG. 2A. The device structures shown in FIGS. 2B and 2C are similar to those of FIGS. 1B and 1C, respectively, except that the diffusion structures 108a, 108b, 110a, and 110b include doped regions 134 and 140.

As shown in FIGS. 2B and 2C, each diffusion structure 108a, 108b, 110a, and 110b may have a plurality of first doped regions 134. The first doped regions 134 in each diffusion structure 108a, 108b, 110a, and 110b are spaced apart from one another by the second doped region 140. The second doped regions 140 in the diffusion structures 108a, 108b, 110a, and 110b are connected to source lines SL1, SL2, SL3, and SL4.

Figure 2D:
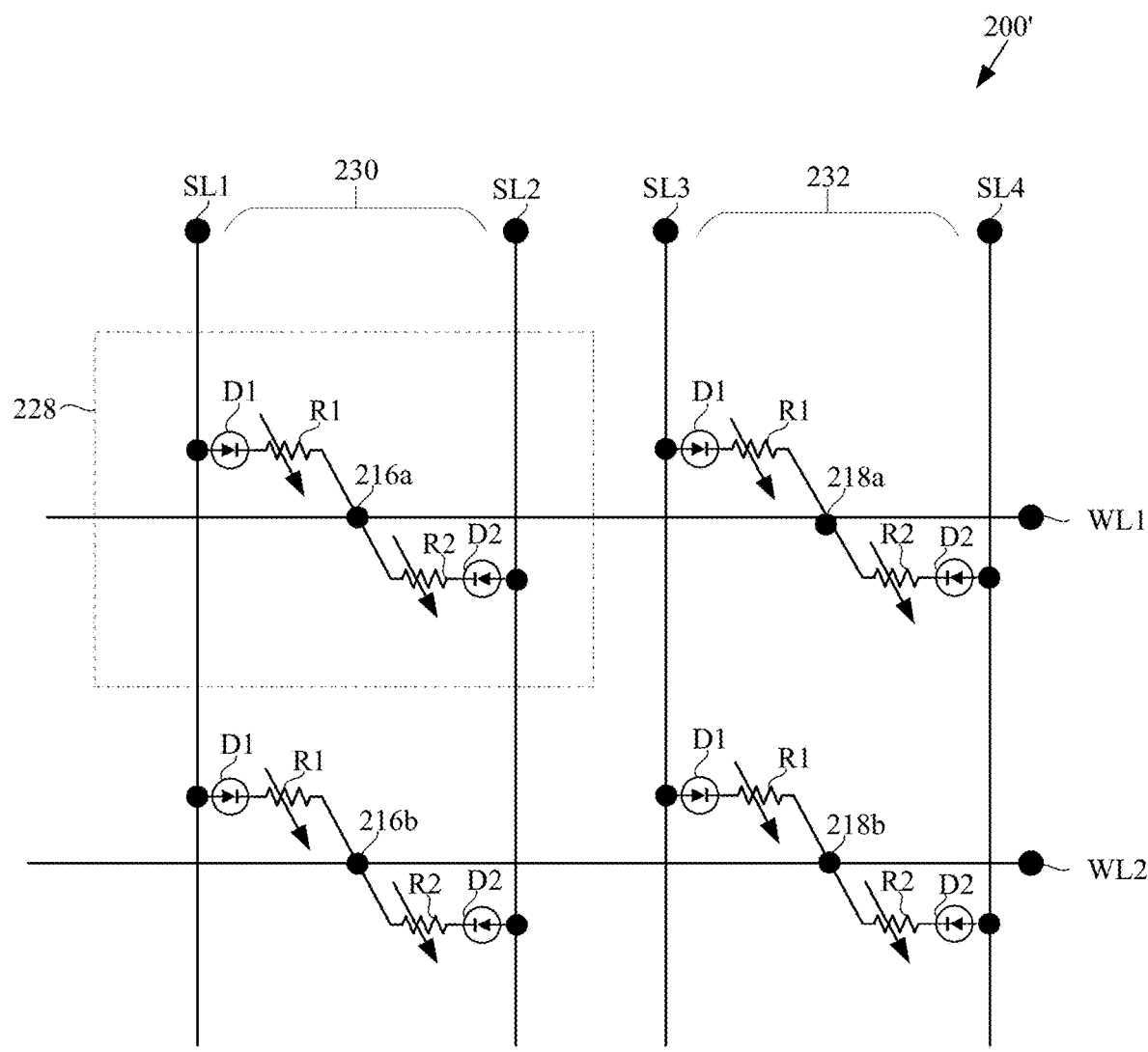
FIG. 2D is a circuit diagram representing the exemplary semiconductor device of FIGS. 2A-2C, in accordance with the present disclosure.

Referring to FIG. 2D, a circuit diagram 200' depicting the electrical connections in the exemplary semiconductor device of FIGS. 2A-2C is shown. The circuit diagram 200' in FIG. 2D is similar to the circuit diagram 200 of FIG. 1D, except that the circuit diagram 200' in FIG. 2D includes diodes D1 and D2.

As shown in FIG. 2D, a memory cell 228 may include a gate 216a connected to a pair of source lines SL1 and SL2 through two resistors R1 and R2 and two diodes D1 and D2. Between the gate and each source line, the diodes D1 and D2 are connected in series with its respective resistors R1 and R2. As an illustrative example, a selected word line WL1 may provide a voltage to the gate 216a, and an electric field is generated across the resistors R1 and R2, which provides biasing of the diodes D1 and D2 (e.g., forward or reverse biasing).

The biasing of the diodes D1 and D2 may enable selective control of transmission of electrical signals between the word lines WL1 and WL2 and the source lines SL1, SL2, SL3, and SL4. In the illustrative example, by controlling the biasing of the diodes D1 and D2, one of the source lines SL1 connected to the gate 216a may be "selected" to allow transmission of electrical signals to and from the word line WL1. On the other hand, the other source line SL2 connected to the gate 216a remains "unselected" and no transmission of electrical signals is allowed.

The resistors R1 and R2 in the circuit diagram 200' may correspond to the implementation of each dielectric layer 112a, 112b, 114a, and 114b, while the diodes D1 and D2 may correspond to the implementation of the first 134 and second 140 doped regions in the diffusion structures 108a, 108b, 110a, and 110b shown in FIGS. 2B and 2C.

Advantageously, the presence of doped regions 134 and 140 in the diffusion structures 108a, 108b, 110a, and 110b may enable selective transmission of electrical signals between the word lines WL1 and WL2 and the source lines SL1, SL2, SL3, and SL4.

Figure 3:
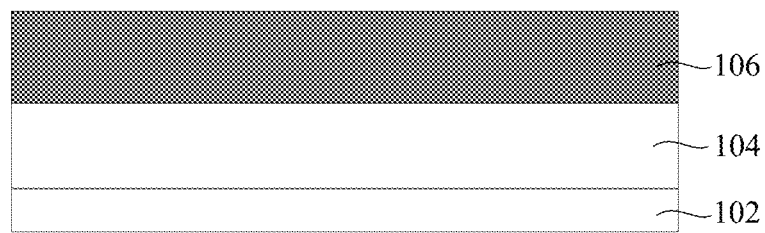
FIG. 3, FIGS. 4A and 4B, FIGS. 5A and 5B, FIGS. 6A and 6B, and FIG. 7 illustrate various stages of forming a semiconductor device in accordance with embodiments of the present disclosure.

Referring to FIG. 3, a "base" device structure for forming a semiconductor device of the present disclosure is shown. The base device structure has a substrate 102, an isolation region 104 formed on the substrate 102, and a dielectric isolation layer 106 formed on the isolation region 104. The base device structure may be formed using various semiconductor fabrication processes.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes.

Figure 4A:
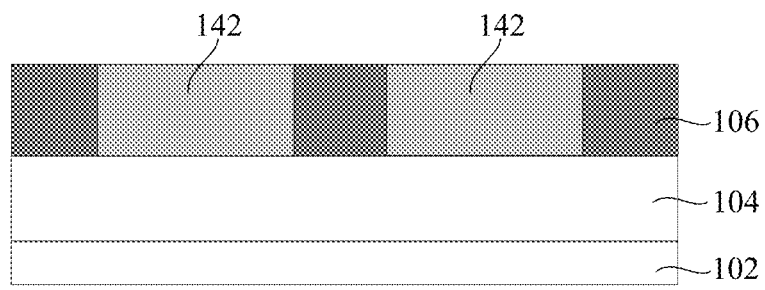

FIG. 4A is a cross-sectional view and continues from the embodiment shown in FIG. 3.

Figure 4B:
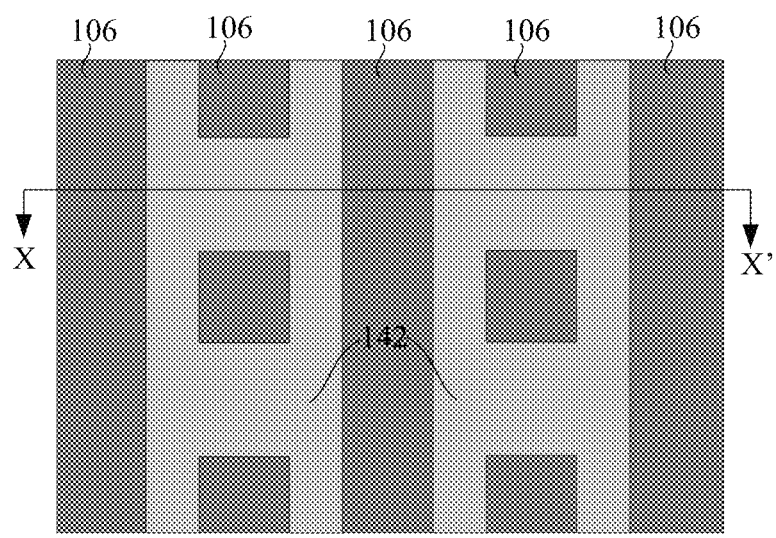

FIG. 4B illustrates the layout configuration of FIG. 4A. The line X-X' in FIG. 4B indicates the cross-section line for the view in FIG. 4A. Referring to FIG. 4A and FIG. 4B, a conductive material 142 is formed in the dielectric isolation layer 106. The formation of the conductive material 142 may be performed by patterning the dielectric isolation layer 106 using patterning techniques to form openings (not shown) on the isolation region 104, followed by filling the openings with the conductive material 142 using deposition techniques.

Figure 5A:
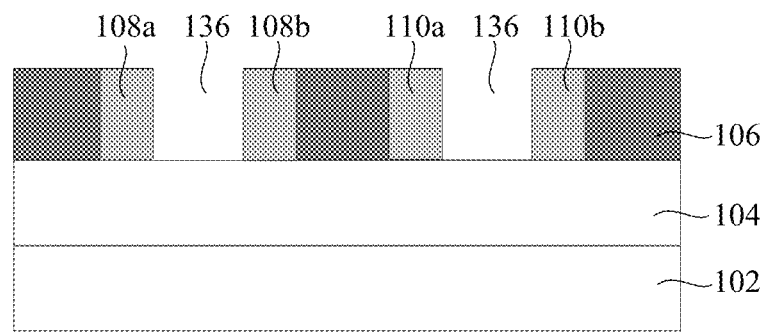
Figure 5B:
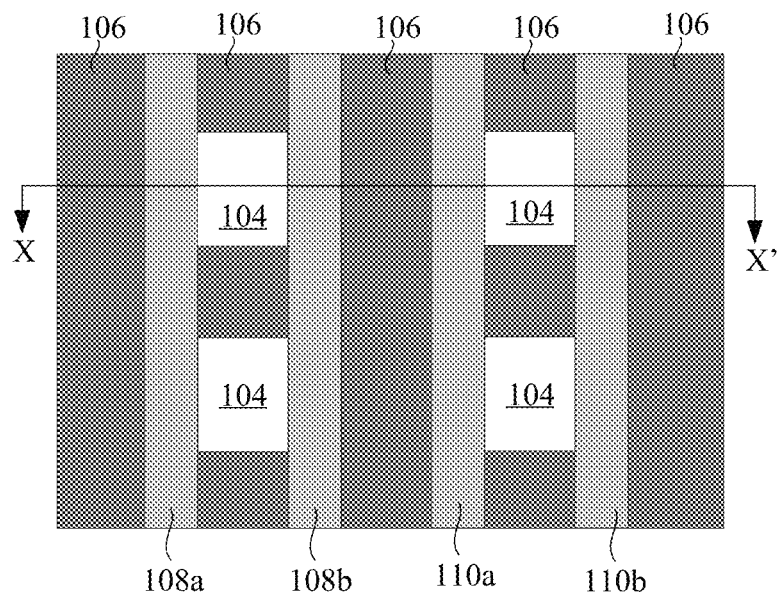

Referring to FIG. 5A and FIG. 5B (FIG. 5A continues from the embodiment shown in FIG. 4A, and FIG. 5B continues from the embodiment shown in FIG. 4B), pairs of diffusion structures 108a, 108b, 110a, and 110b are formed by patterning the conductive material 142 using patterning techniques. The patterning of the conductive material 142 may form cavities 136 between each pair of diffusion structures 108a, 108b, 110a, and 110b and exposes the underlying isolation region 104.

Figure 6A:
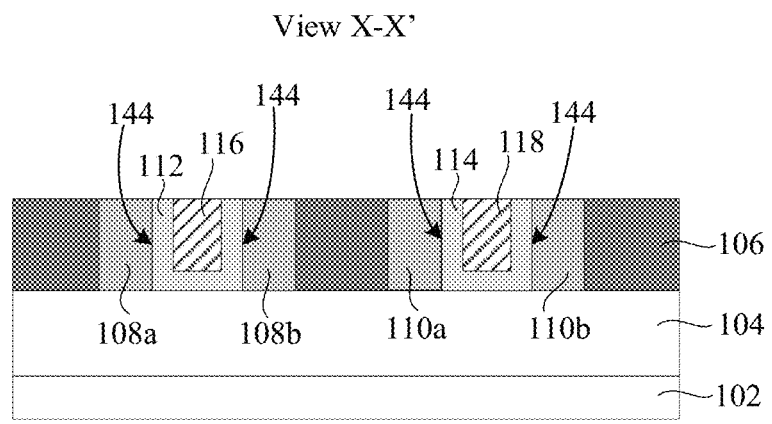
Figure 6B:
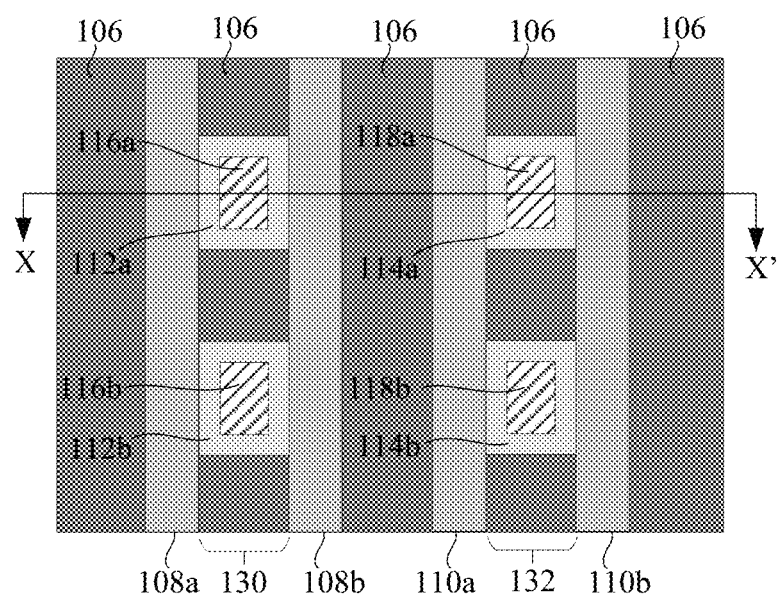

Referring to FIG. 6A and FIG. 6B (FIG. 6A continues from the embodiment shown in FIG. 5A, and FIG. 6B continues from the embodiment shown in FIG. 5B), the dielectric layers 112 and 114 and the gate structures 116 and 118 are formed in the cavities.

As shown in FIG. 6A, the dielectric layers 112 and 114 may be deposited (using deposition processes) upon the isolation region 104 and on side surfaces 144 of the diffusion structures 108a, 108b, 110a, and 110b. Thereafter, the gate structures 116 and 118 may be formed using techniques employed in replacement metal gate (RMG) processes. It should be understood that the RMG process is described at this point in the sequence as an example. The RMG process will be apparent to those of ordinary skill in the art without departing from the scope and spirit of this disclosure.

As shown in FIG. 6B, an array of gate structures are formed between each pair of diffusion structures. For example, a first array 130 of gate structures is formed between the first pair of diffusion structures 108a and 108b, and a second array 132 of gate structures is formed between the second pair of diffusion structures 110a and 110b.

To fabricate the device structures shown in FIGS. 2A-2C, doped regions may be formed in the diffusion structures 108a, 108b, 110a, and 110b. The doped regions may be formed using doping techniques such as ion implantation with the use of a mask and a dopant of a conductivity type as described herein.

Figure 7:
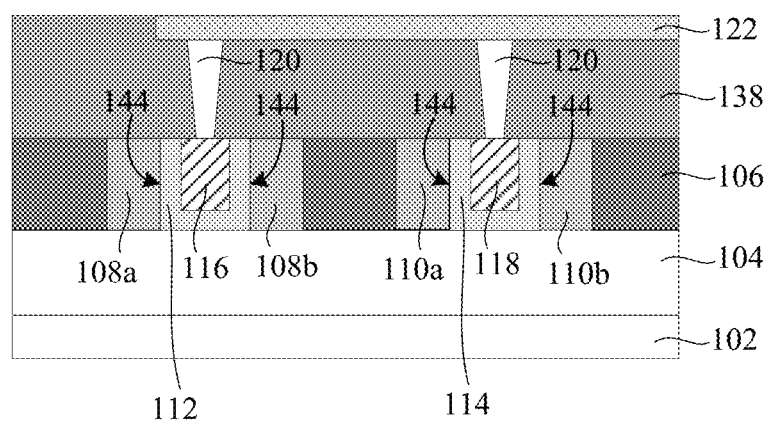

FIG. 7 is a cross-sectional view and continues from the embodiment shown in FIG. 6A. As shown in FIG. 7, interconnect structures, such as conductive lines 122 and interconnect vias 120, may be formed above the device structure of FIG. 6A. The interconnect structures may be embedded within a dielectric structure 138. The dielectric structure 138 may include dielectric layers (e.g., polyimide, silicon dioxide, etc.) and may be formed on the device structure of FIG. 6A. The interconnect structures 120 and 122 and the dielectric structure 138 may be formed using semiconductor processes.

Figure 8:
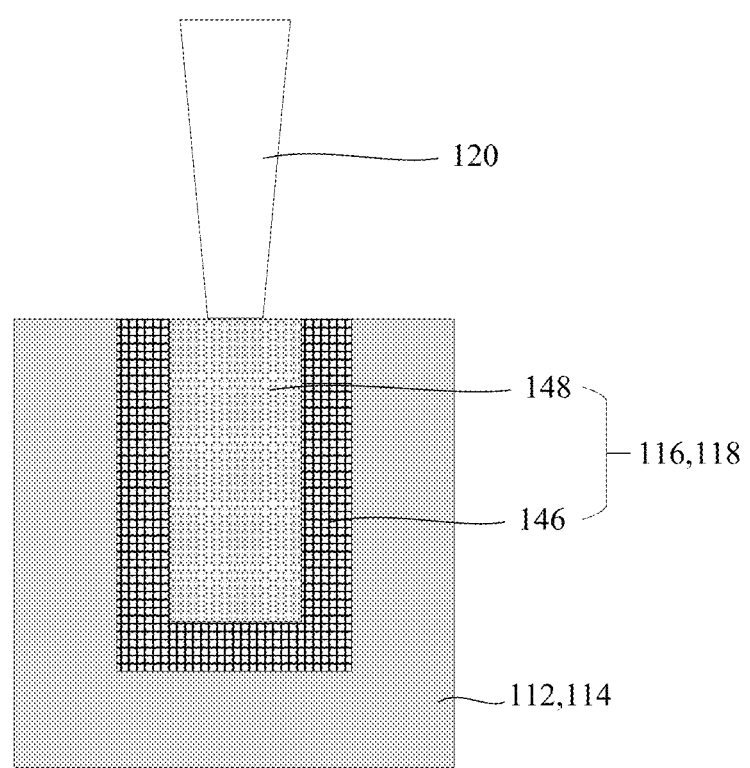
FIG. 8 is a cross-sectional view depicting an exemplary arrangement of the components in a gate structure, in accordance with embodiments of the present disclosure.

FIG. 8 illustrates an exemplary arrangement of a metal electrode 148 and a WFM component 146 within a gate structure 116 and 118 described herein. The WFM component 146 may be formed on the dielectric layer 112 and 114. The metal electrode 148 may be formed on the WFM component 146. Formation of the metal electrode 148 and the WFM component 146 may be performed using deposition techniques. Interconnect structures, such as an interconnect via 120 as described herein, may be formed on the metal electrode 148.

Although the accompanying drawings illustrate two gate structures in a single array, it should be understood that arrays having more than two gate structures are also contemplated within the scope of the present disclosure. In other words, each pair of diffusion structures may extend laterally to have portions that are adjacent to at least two gate structures in an array. Additionally, devices having two or more arrays above the isolation region are also contemplated within the scope of the present disclosure.

It is understood that the following disclosure is not limited to any particular type of semiconductor devices. The devices and methods disclosed herein may be applied to any type of semiconductor device architecture, such as tri-gate field-effect transistor (FET) devices, fin-type FET (FinFET) devices or planar-type metal-oxide-semiconductor FET (MOSFET) devices.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A semiconductor device comprising:
an isolation region disposed on a substrate;
a pair of diffusion structures disposed upon the isolation region;
a first dielectric layer that covers side surfaces of the diffusion structures;
a first gate structure disposed on the first dielectric layer and between the diffusion structures, wherein the first gate structure is electrically coupled to the diffusion structures;
a second dielectric layer disposed upon the isolation region and covers the side surfaces of the diffusion structures; and a second gate structure disposed on the second dielectric layer and between the diffusion structures, wherein the second gate structure is electrically coupled to the pair of diffusion structures.

2. The device of claim 1, wherein each diffusion structure of the pair of diffusion structures includes a first doped region and a second doped region, the first doped region and the second doped region have opposite conductivity types with respect to each other.

3. The device of claim 2, wherein the first and the second dielectric layers directly overlie the first doped region of each diffusion structure.

4. The device of claim 1, wherein the first and the second gate structures are peripherally enclosed by the first and the second dielectric layers respectively.

5. The device of claim 1, wherein the first and the second gate structures are configured to receive a voltage to control an electrical characteristic of the diffusion structures.

6. The device of claim 1, wherein the diffusion structures include a conductive material.

7. A semiconductor device comprising:
an isolation region disposed on a substrate;
a first array above the isolation region, the first array comprising a first gate structure disposed on a first dielectric layer and a second gate structure disposed on a second dielectric layer;
a first pair of diffusion structures disposed upon the isolation region,
the first dielectric layer and the second dielectric layer cover side surfaces of the first pair of diffusion structures, wherein the first and second gate structures are disposed between and electrically coupled to the first pair of diffusion structures;
a second array above the isolation region and spaced apart from the first array, the second array comprising a third gate structure disposed on a third dielectric layer and a fourth gate structure disposed on a fourth dielectric layer; and
a second pair of diffusion structures disposed upon the isolation region,
the third dielectric layer and the fourth dielectric layer cover side surfaces of the second pair of diffusion structures, wherein the third and fourth gate structures are disposed between and electrically coupled to the second pair of diffusion structures.

8. The device of claim 7, wherein the gate structures in the first array are coupled to the gate structures in the second array.

9. The device of claim 8, wherein the gate structures in the first array are connected to the gate structures in the second array by conductive lines that extend perpendicularly across the diffusion structures.

10. The device of claim 7, wherein each diffusion structure of the first and second pairs of diffusion structures includes a first doped region and a second doped region, the first doped region and the second doped region have opposite conductivity types with respect to each other.

11. The device of claim 10, wherein each dielectric layer of the first array and the second array directly overlies the first doped region of each diffusion structure.

12. The device of claim 7, further comprising:
a first conductive line connected to the first gate structure and the third gate structure; and
a second conductive line connected to the second gate structure and the fourth gate structure.

13. The device of claim 12, wherein the first conductive line and the second conductive line are word lines.

14. A method of forming a semiconductor device comprising:
forming an isolation region on a substrate;
forming a pair of diffusion structures upon the isolation region;
forming a first dielectric layer and a second dielectric layer, the first dielectric layer and the second dielectric layer to cover side surfaces of the diffusion structures; and
forming a first gate structure on the first dielectric layer and a second gate structure on the second dielectric layer, wherein the first gate structure and the second gate structure are is between the pair of diffusion structures.

15. The method of claim 14, further comprising forming a first doped region and a second doped region in each diffusion structure of the pair of diffusion structures, wherein the first and second doped regions have opposite conductivity types with respect to each other.

16. The method of claim 14, wherein the forming of the pair of diffusion structures comprises:
forming a dielectric isolation layer on the isolation region;
patterning the dielectric isolation layer;
forming a conductive material in the patterned dielectric isolation layer;
patterning the conductive material to form the pair of diffusion structures and a gate cavities between the pair of diffusion structures.

17. The method of claim 16, wherein the first dielectric layer and the second dielectric layer are is formed in the gate cavities.

18. The method of claim 14, further comprising forming a first conductive line above the first gate structure and a second conductive line above the second gate structure, the first conductive line connects to the first gate structure and the second conductive line connects to the second gate structure.

19. The method of claim 18, wherein the first conductive line and the second conductive line are formed perpendicular to the diffusion structures.

* * * * *